US011443881B1

(12) United States Patent
Farahani

(10) Patent No.: US 11,443,881 B1
(45) Date of Patent: Sep. 13, 2022

(54) INTEGRATION OF ENCLOSURE AND CORE FOR IMPROVED STRUCTURAL INTEGRITY OF AN IMPEDANCE INJECTION UNIT

(71) Applicant: Smart Wires Inc., Union City, CA (US)

(72) Inventor: Ali Farahani, Yorba Linda, CA (US)

(73) Assignee: Smart Wires Inc., Union City, CA (US)

( * ) Notice: Subject to any disclaimer, the term of this patent is extended or adjusted under 35 U.S.C. 154(b) by 241 days.

(21) Appl. No.: 16/521,144

(22) Filed: Jul. 24, 2019

Related U.S. Application Data

(60) Provisional application No. 62/848,997, filed on May 16, 2019.

(51) Int. Cl.

| | |
|---|---|
| ***B23P 19/00*** | (2006.01) |
| ***H05K 13/04*** | (2006.01) |
| ***H01F 27/02*** | (2006.01) |
| ***H01F 41/02*** | (2006.01) |
| ***H01F 27/245*** | (2006.01) |
| ***H01F 27/30*** | (2006.01) |
| ***H01F 27/26*** | (2006.01) |

(52) U.S. Cl.
CPC ........... *H01F 27/02* (2013.01); *H01F 27/245* (2013.01); *H01F 27/266* (2013.01); *H01F 27/306* (2013.01); *H01F 41/0233* (2013.01)

(58) Field of Classification Search
CPC ...... H01F 27/02; H01F 27/246; H01F 27/266; H01F 27/306; H01F 41/0233
See application file for complete search history.

(56) References Cited

U.S. PATENT DOCUMENTS

| | | | | |
|---|---|---|---|---|
| 3,761,853 A * | 9/1973 | Schutz | H01F 29/10 336/58 |
| 4,782,700 A * | 11/1988 | Hulsing | G01C 19/5769 73/504.12 |
| 6,042,248 A | 3/2000 | Hannah et al. | |
| 10,747,244 B2 * | 8/2020 | Manhart | H01F 27/263 |
| 2015/0279544 A1 * | 10/2015 | Singh | H01F 27/245 336/170 |
| 2019/0190306 A1 * | 6/2019 | Sosinov | B60L 1/00 |

FOREIGN PATENT DOCUMENTS

CN 108335869 A * 7/2018

* cited by examiner

*Primary Examiner* — Paul D Kim
(74) *Attorney, Agent, or Firm* — Womble Bond Dickinson (US) LLP

(57) ABSTRACT

Sheet metal construction is described for achieving high strength at low weight for a power reactor and for an impedance injection module incorporating the power reactor. Clamping plates are used to retain the core and the windings of the reactor. Integrated features of a specialized frame of the impedance injection module include flanges for structural rigidity, a convenient yoke plate for lifting by crane, feet for mounting insulators, and sufficient strength to maintain mechanical integrity during normal operation and also during fault conditions. The specialized frame provides a light weight assembly suitable for mounting on power transmission lines as well as on ground assemblies. The specialized frame can reduce the cost of the total enclosure to around 25% of the cost and 50% of the weight of an equivalent conventional enclosure. An insulation topology is also described.

17 Claims, 6 Drawing Sheets

INTEGRATION OF ENCLOSURE AND CORE FOR IMPROVED STRUCTURAL INTEGRITY OF AN IMPEDANCE INJECTION UNIT

This application claims benefit of priority from U.S. Provisional Application No. 62/848,997, titled "Integration of Enclosure and Core for Improved Structural Integrity of an Impedance Injection Unit", filed May 16, 2019, which is hereby incorporated by reference.

TECHNICAL FIELD

This invention relates to the integration of structural elements and insulating materials in an impedance injection unit, as a component of a power flow control system, and more particularly to the use of sheet metal structural elements and insulating materials in an impedance injection unit.

BACKGROUND

Power flow control devices that are constructed for optional attachment to power transmission lines are preferably light in weight and of minimum size.

Accordingly, there is a need in the art for novel construction methods and insulation methods to achieve light weight and minimum size of power flow control devices.

SUMMARY

A frame for a transformer is disclosed. The frame has a first clamping plate, a second clamping plate, insulating sheets, laminated magnetic cores, and primary and secondary windings. The frame is arranged to retain all transformer elements without mechanical failure during normal operating conditions and during a fault current. The fault current is in a range of 25 kA to 170 kA in a winding of the transformer.

A frame for an impedance injection unit is disclosed. The frame has a plurality of sheet metal components and insulation materials. The sheet metal components include clamping plates and a support bar. The sheet metal components have shapes and bending to provide stiffening and construction having light weight and structural strength. The structural strength is sufficient to withstand stress related to a fault current flowing in a series connection of the impedance injection unit and a power transmission line, without mechanical failure. Magnitude of the fault current ranges from 25 kA to 170 kA.

A method for constructing an impedance injection unit is disclosed. The method includes implementing a plurality of structural members using sheet metal components. Laminated magnetic core elements are assembled. A primary winding, coupled to the laminated magnetic core elements, is assembled. A secondary winding, coupled to the primary winding and coupled to the laminated magnetic core elements, is assembled. Each of the primary winding and the secondary winding is wrapped with a flexible wrap comprising aramid fibers. The method includes assembling the plurality of structural members, the primary winding and the secondary winding and the laminated core elements to form the impedance injection unit.

A method for constructing an impedance injection unit is disclosed. The method includes defining a set of sheet metal components as structural elements of an impedance injection unit. The sheet metal components are stamped to form shapes. The method includes bending the sheet metal components to provide stiffening elements comprising flanges, and providing attachment points for additional hardware. The method includes integrating an impedance injection unit using the sheet metal components and using insulating materials. The insulating materials are selected and configured to optimize dielectric and heat conduction properties at each location.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Sheet metal construction is described for achieving high strength at low weight for a power reactor and for an impedance injection module incorporating the power reactor. Clamping plates are used to retain the core and the windings of the reactor. Integrated features of a specialized frame of the impedance injection module include flanges of the sheet metal components for structural rigidity, a convenient yoke plate for lifting by crane, feet for mounting insulators, and sufficient strength to maintain mechanical integrity during normal operation and also during fault conditions. Fault conditions may comprise a fault current ranging from 25 kA-170 kA for example, and the large fault current may induce a force exceeding 1,000 pounds at an external NEMA (National Electrical Manufacturers Association) connector.

The specialized frame provides a light weight assembly suitable for mounting on power transmission lines as well as on ground assemblies. The specialized frame can reduce the cost of the total enclosure to around 25% of the cost of an equivalent conventional enclosure. An insulation topology is also described.

Figure 1:
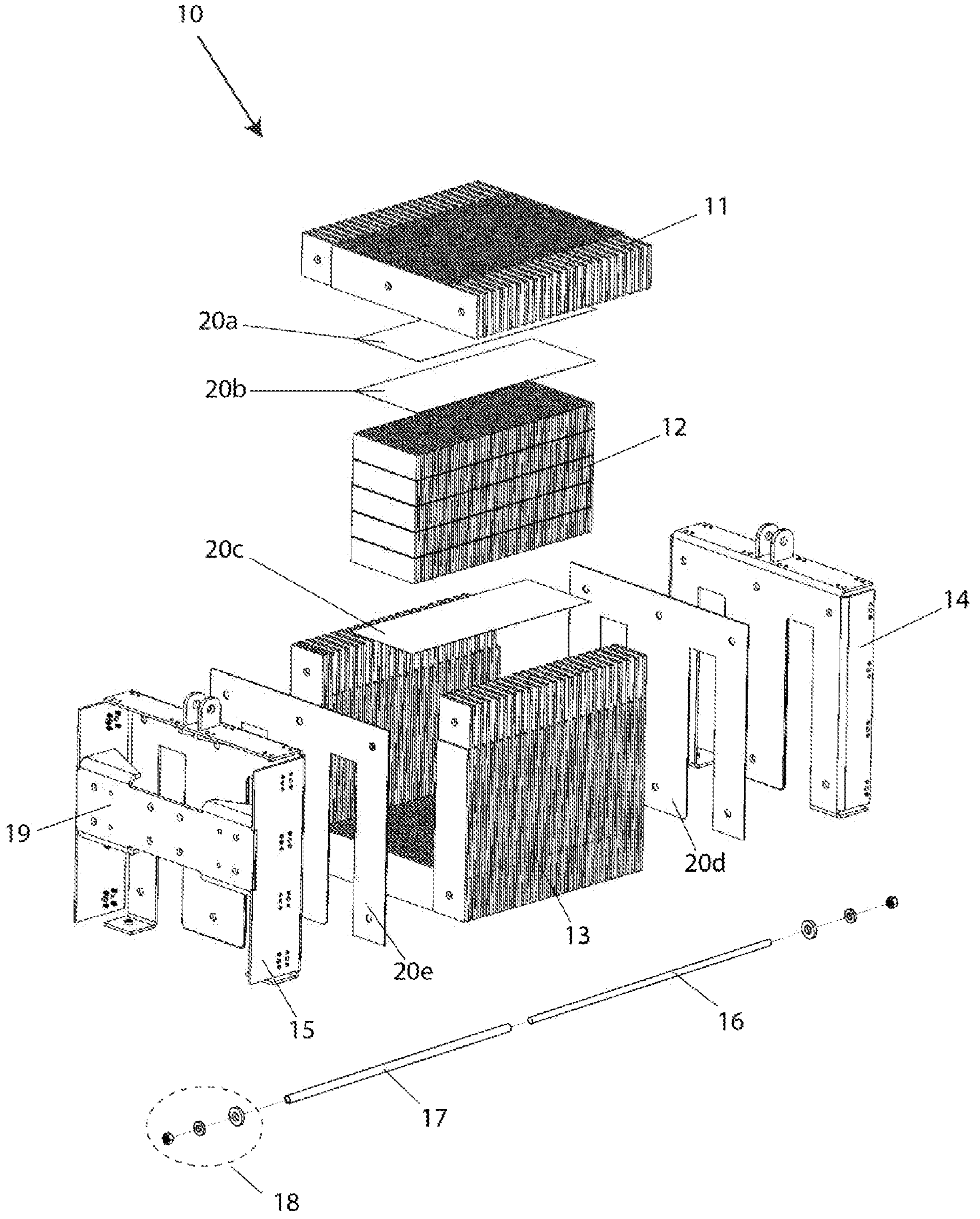
FIG. 1 illustrates the use of sheet metal components and clamping rods in the integration of a power transformer.

FIG. 1 illustrates an integration 10 of mechanical components including a power reactor. The power reactor may be a reactor, an inductor, or a transformer. Three laminated magnetic core elements include: an upper laminated core 11, a central laminated core 12, and a C-shaped laminated core 13. These core elements are clamped together using a first clamping plate 14, a second clamping plate 15, and clamping rods such as clamping rod 16. Clamping rod 16 may be further equipped with an insulating sheath 17 and a set of fasteners 18 at each end. Clamping rod fasteners may include nuts and washers and the like. A primary support bar 19 is shown, representing a heavy-duty structural element implemented as a sheet metal component. Various insulating materials may be employed, shown at 20*a*, 20*b*, 20*c*, 20*d*, 20*e* and 17; they may comprise a single material or a combination of materials selected from, for example: polyimide (e.g. Kapton™), Nomex™ 410 insulation paper with high dielectric strength, Nomex/Kapton/Nomex (NKN), Thermavolt calendared inorganic insulating paper available from 3M™ Company, and Glastic™ composites in the Flexible High Temperature (FHT) grade laminate. In each location where an insulating material is used, the material choice may result from an optimization of a combination of properties including for example dielectric strength and thermal conductivity.

Sheet metal components, when appropriately shaped with flanges and angled elements, represent a low weight and low-cost alternative for structural elements. They can be stamped to create a custom outline. They can then be shaped using a sheet metal brake for example. Their thickness can be tailored in each location, depending on the strength required, thus providing the required strength while minimizing weight and cost. For an assembly such as an impedance injection unit described herein, the cost of a sheet metal assembly may be only 25% of an equivalent structural assembly not using sheet metal components. Similarly, the weight of such an assembly may be less than 50% of the weight of an assembly that uses metal bars as strength elements.

Figure 2:
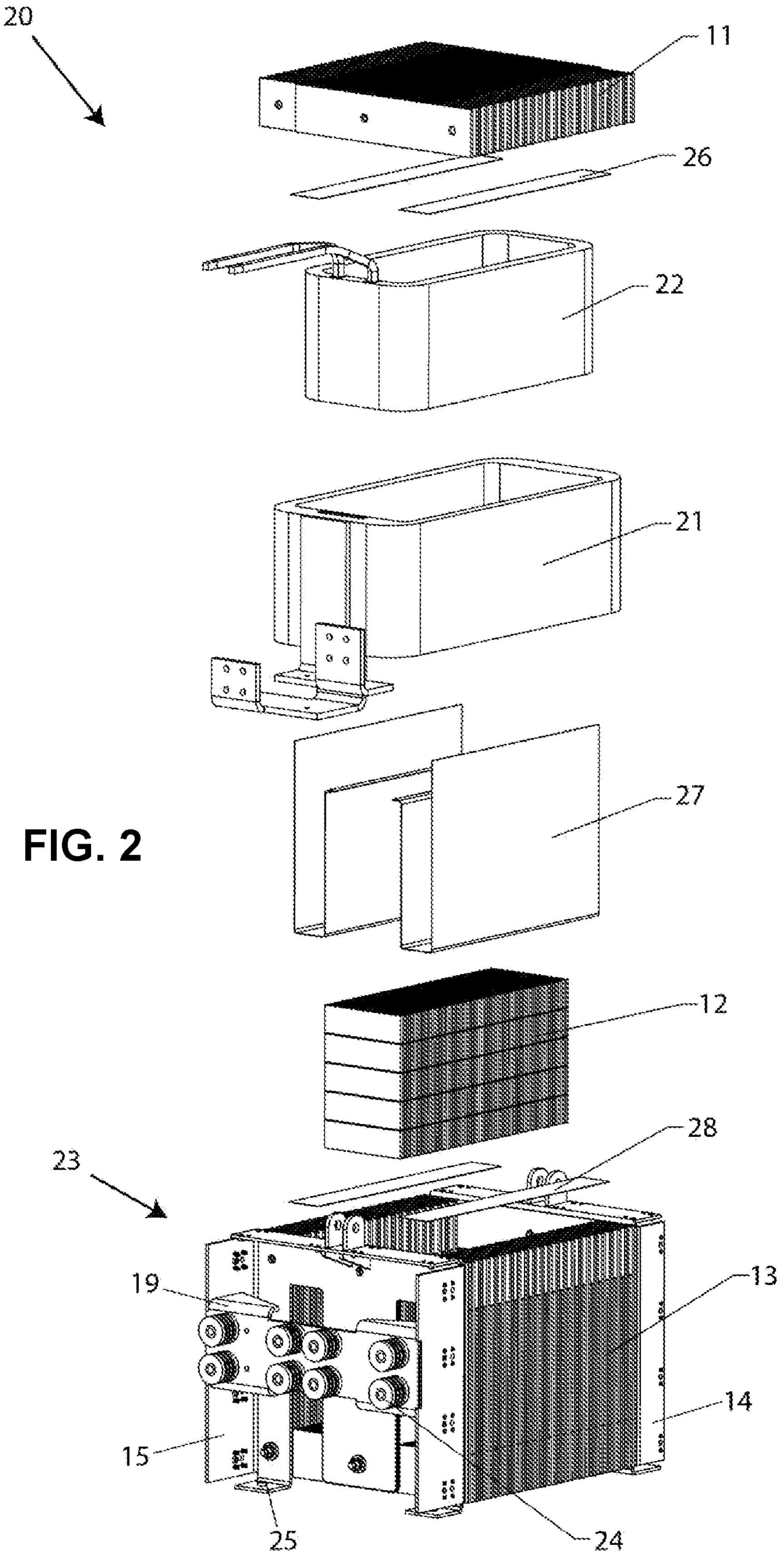
FIG. 2 illustrates an insulation topology for the power transformer of FIG. 1.

FIG. 2 illustrates a further integration of a power flow control subsystem 20. Subsystem 20 includes upper laminated core 11, central laminated core 12, C-shaped laminated core 13, primary winding 21, secondary winding 22, first clamping plate 14, second clamping plate 15, primary support bar 19, and partially assembled reactor 23. Post insulator 24 is also shown, and a set of feet 25 which may be used during deployment for connection to an insulating element for example. FIG. 2 also illustrates an insulation topology, including FHT Glastic™ sheets 26, secondary winding 22 configured with continuously transposed conductors (CTC) and a Nomex™ 410 winding wrap 27, primary winding 21 comprising a copper foil winding with Nomex™ 410 insulation between turns, and additional FHT Glastic™ sheets 28 as shown.

Figure 3:
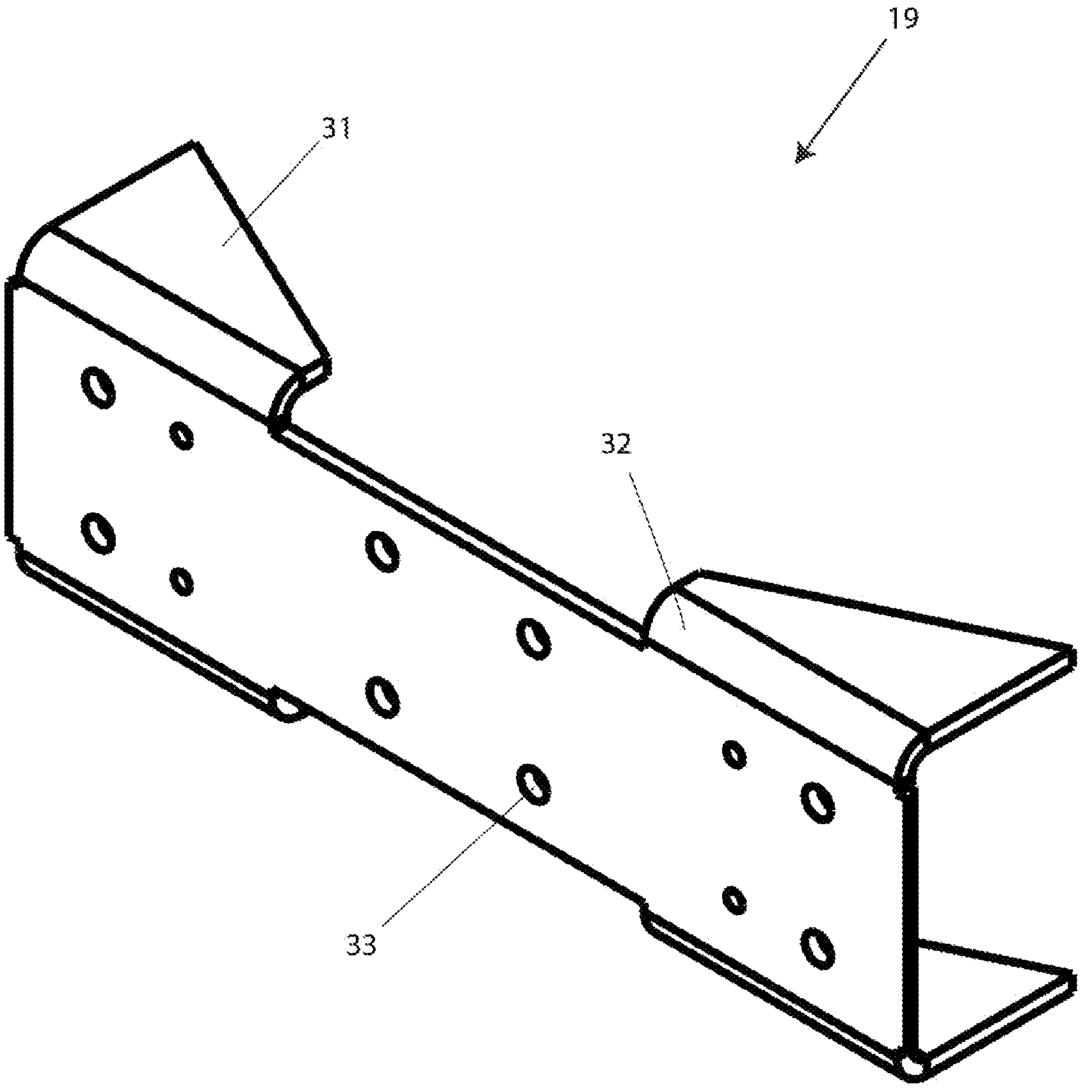
FIG. 3 illustrates a primary support bar as an example of a heavy-duty structural element implemented using a sheet metal component.

FIG. 3 illustrates a heavy-duty sheet metal component, the primary support bar 19 of FIGS. 1 and 2. Primary support bar 19 includes flanges as stiffening elements, fillets 32, and mounting holes 33. The thickness and the shape of support bar 19 can be tailored to its strength requirements. Clearly this is a versatile structural element, providing means to bind together several components at high strength using a low weight, low cost component.

Figure 4:
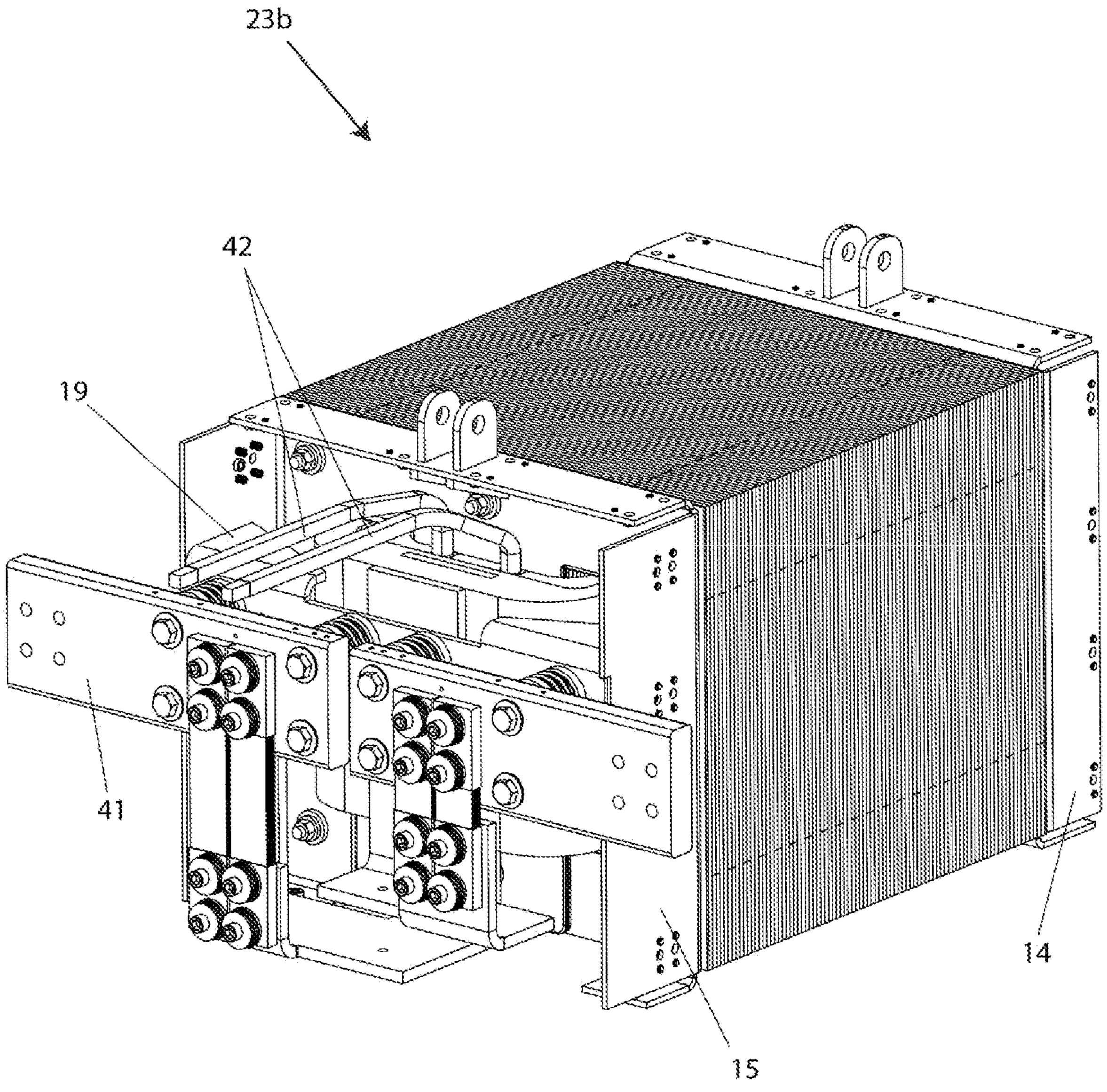
FIG. 4 illustrates further integration of the power reactor portion of an impedance injection unit.

FIG. 4 illustrates a further integration 23*b* of the subsystem 23 depicted in FIG. 2. First clamping plate 14 and second clamping plate 15 are shown, together with primary support bar 19. Terminations 42 of secondary winding 22 are also shown. Additional mounting hardware 41 connects to primary support bar 19 through post insulators 24. NEMA pads may be attached using mounting hardware 41, the NEMA pad being a standard means for connecting to a high voltage transmission line.

Figure 5:
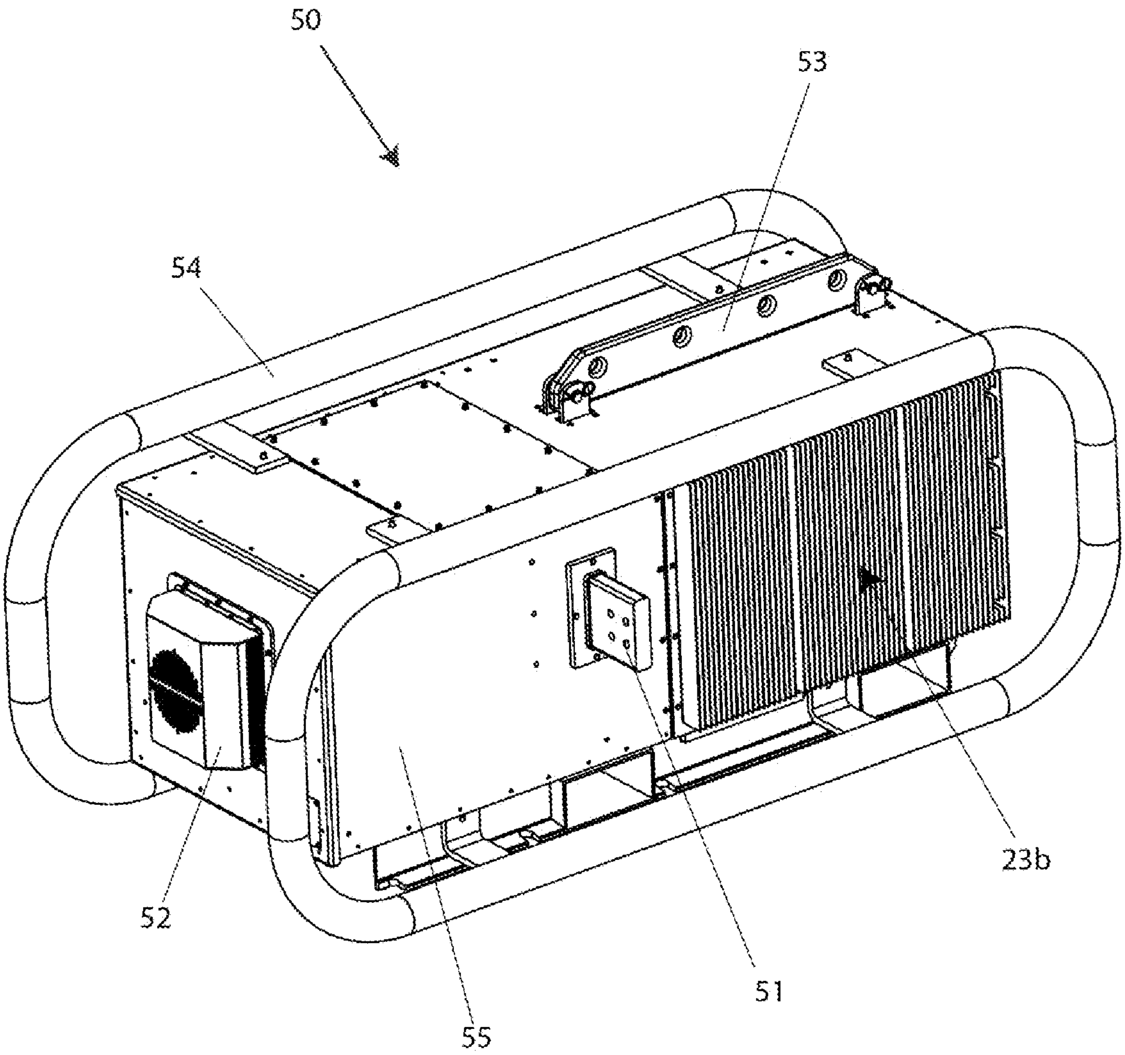
FIG. 5 illustrates a complete impedance injection unit including a sheet metal outer skin and attached components.

FIG. 5 illustrates a complete impedance injection unit 50, constructed using sheet metal structural elements and insulation materials in accordance with the present disclosure. Reactor subsystem 23*b* is shown, together with NEMA connector 51, cooling fan 52 and yoke plate 53. Yoke plate 53 supports deployment of impedance injection unit 50 using a crane for example. A corona ring 54 is shown, helping to reduce interference between impedance injection units, and between those units and ground. The interference may include arcing for example. Sheet metal enclosure 55 is shown, providing a further structural element of impedance injection unit 50.

Figure 6:
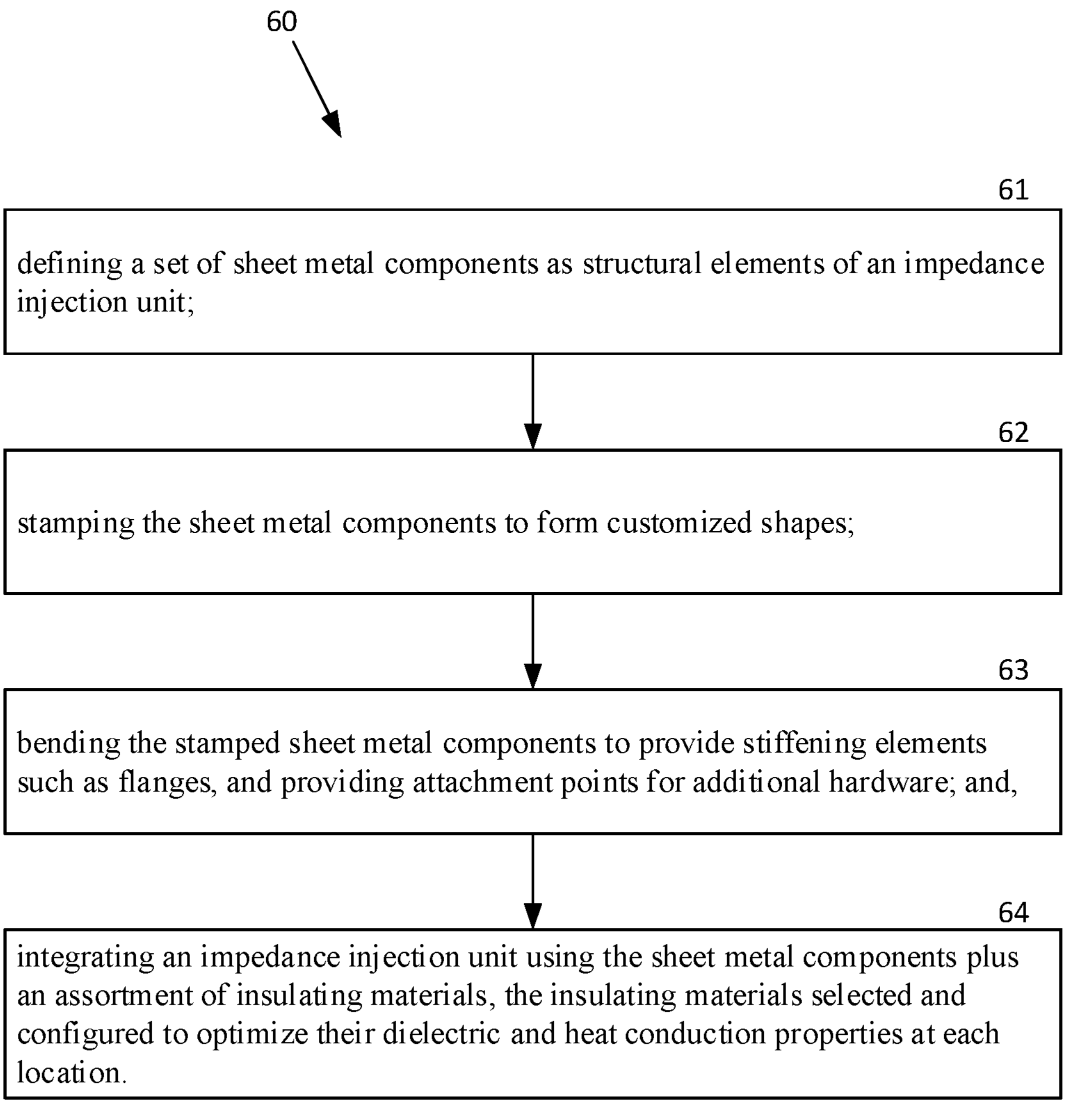
FIG. 6 is a flow chart of a method for constructing an impedance injection unit.

FIG. 6 is a flow chart of a method for constructing an impedance injection unit using sheet metal components as structural elements. The method begins with defining a set of sheet metal components as structural elements of an impedance injection unit, step 61; continues with stamping the sheet metal components to form customized shapes, step 62; further continues with bending the stamped sheet metal components to provide stiffening elements such as flanges, and providing attachment points for additional hardware, step 63. The method concludes with the step of integrating an impedance injection unit using the sheet metal components plus an assortment of insulating materials, the insulating materials selected and configured to optimize their dielectric and heat conduction properties at each location, step 64.

What is claimed is:

1. An assembly for an impedance injection unit comprising:

a frame having a plurality of sheet metal components, comprising clamping plates and a support bar, arranged for integration of enclosure and core of the impedance injection unit, wherein the frame is to retain an upper laminated core in the shape of a rectangular prism, a central laminated core in the shape of a rectangular prism, a C-shaped laminated core, a toroidal secondary winding surrounding the central laminated core and a toroidal primary winding surrounding the toroidal secondary winding; and insulation materials; wherein the plurality of sheet metal components have shapes and bending to provide stiffening and construction having light weight and structural strength sufficient to withstand, without mechanical failure, stress related to a fault current flowing in a series connection of the impedance injection unit in a power transmission line, wherein magnitude of the fault current ranges from 25 kA to 170 kA.

2. The assembly for the impedance injection unit of claim 1 further comprising an attached yoke plate for lifting the impedance injection unit.

3. The assembly for the impedance injection unit of claim 1 further comprising individual feet elements for attaching insulators.

4. The assembly for the impedance injection unit of claim 1 further comprising an attached sheet metal enclosure.

5. The assembly for the impedance injection unit of claim 1 further comprising an attachable corona ring.

6. The assembly for the impedance injection unit of claim 1 further comprising at least one a NEMA (National Electrical Manufacturers Association) connector for connecting to the power transmission line.

7. The assembly for the impedance injection unit of claim 6, wherein the frame has sufficient strength to maintain mechanical integrity and withstand, without mechanical failure, without mechanical failure a fault current in the power transmission line that creates an induced force exceeding 1,000 pounds at the NEMA connector as a result of the fault current flowing in the series connection having a magnitude that ranges from 25 kA to 170 kA.

8. The assembly for the impedance injection unit of claim further comprising the impedance injection unit, with the frame mechanically coupled to a power transformer of the impedance injection unit, wherein the power transformer comprises:

a top core and an outer core, wherein the top core comprises the upper laminated core;

the central laminated core, magnetically coupled to the top core and to the outer core;

wherein the outer core is the C-shaped laminated core with a left arm and a right arm opposing two sides of the central laminated core, and a bottom arm opposing a base of the central laminated core;

the toroidal secondary winding, surrounding the central laminated core; and the toroidal primary winding, surrounding the toroidal secondary winding.

9. The assembly for the impedance injection unit of claim 8 wherein the toroidal secondary winding comprises a continuously transposed conductor (CTC) wire with an insulating wrap.

10. The assembly for the impedance injection unit of claim 9 wherein the insulating wrap comprises aramid fibers.

11. The assembly for the impedance injection unit of claim 8 wherein the toroidal primary winding comprises copper foil with an insulation between turns.

12. The assembly for the impedance injection unit of claim 11 wherein the insulation between turns comprises aramid fibers.

13. The assembly for the impedance injection unit of claim 8 wherein the insulation materials comprise insulating sheets disposed between the magnetic core elements and winding elements.

14. The assembly for the impedance injection unit of claim 13 wherein the insulating sheets comprise a flexible laminate having high dielectric strength and high temperature operability.

15. The assembly for the impedance injection unit of claim 14 wherein the flexible laminate comprises FHT Glastic™ material.

16. The assembly for the impedance injection unit of claim 8 wherein the insulation materials comprise an insulating wrap around at least one of the toroidal primary winding and the toroidal secondary winding.

17. The assembly for the impedance injection unit of claim 16 wherein the insulating wrap comprises aramid fibers.

* * * * *